(12) United States Patent
Adkisson et al.

(10) Patent No.: US 7,732,845 B2
(45) Date of Patent: Jun. 8, 2010

(54) PIXEL SENSOR WITH REDUCED IMAGE LAG

(75) Inventors: James W Adkisson, Jericho, VT (US); Jeffrey P. Gambino, Westford, VT (US); Rajendran Krishnasamy, Junction, VT (US); Solomon Mulugeta, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 231 days.

(21) Appl. No.: 12/099,339

(22) Filed: Apr. 8, 2008

(65) Prior Publication Data

US 2009/0250733 A1    Oct. 8, 2009

(51) Int. Cl.
*H01L 31/062* (2006.01)
(52) U.S. Cl. ......................................... 257/292; 438/48
(58) Field of Classification Search ................ 257/292; 438/48

See application file for complete search history.

(56) References Cited

U.S. PATENT DOCUMENTS 6,380,558 B1 * 4/2002 Yamazaki et al. .............. 257/57
6,750,912 B1    6/2004 Tennant et al.
7,164,182 B2    1/2007 Mouli
2007/0057298 A1    3/2007 Mouli

FOREIGN PATENT DOCUMENTS

WO    WO2005008782    1/2005

* cited by examiner

*Primary Examiner*—Douglas M Menz
(74) *Attorney, Agent, or Firm*—Scully, Scott, Murphy & Presser, P.C.; Anthony Canale

(57) ABSTRACT

A tensile-stress-generating structure is formed above a gate electrode in a CMOS image sensor to apply a normal tensile stress between a charge collection well of a photodiode, which is also a source region of a transfer transistor, and a floating drain in the direction connecting the source region and the floating drain. The tensile stress lowers the potential barrier between the source region and the body of the transfer transistor to effect a faster and more through transfer of the electrical charges in the source region to the floating drain. Image lag is thus reduced in the CMOS image sensor. Further, charge capacity of the source region is also enhanced due to the normal tensile stress applied to the source region.

35 Claims, 10 Drawing Sheets

PIXEL SENSOR WITH REDUCED IMAGE LAG

FIELD OF THE INVENTION

The present invention relates to a semiconductor structure, and particularly to a pixel sensor cell structure having reduced image lag and enhanced capacitance, and methods of manufacturing the same.

BACKGROUND OF THE INVENTION

An image sensor converts a visual image to digital data that may be represented by a picture. The image sensor comprises an array of pixel sensor cells, which are unit devices for the conversion of the visual image into the digital data. Digital cameras and optical imaging devices employ an image sensor. Image sensors include charge-coupled devices (CCDs) or complementary metal oxide semiconductor (CMOS) image sensors.

While CMOS image sensors have been more recently developed compared to the CCDs, CMOS image sensors provide an advantage of lower power consumption, smaller size, and faster data processing than CCDs as well as direct digital output that is not available in CCDs. Also, CMOS image sensors have lower manufacturing cost compared with the CCDs since many standard semiconductor manufacturing processes may be employed to manufacture CMOS image sensors. For these reasons, commercial employment of CMOS image sensors has been steadily increasing in recent years.

A CMOS image sensor unit cell comprises a pixel area and a logic area. The pixel area typically contains one of each type of active pixel, e.g., a red pixel having a first photodiode underneath a red optical filter, a green pixel having a second photodiode underneath a green optical filter, and a blue pixel having a third photodiode underneath a blue optical filter. The pixel area may also contain a dark pixel, which is covered with an opaque layer such as an aluminum light shield and employed to measure a background output level in the absence of illumination so that the output of other pixels may be referenced and calibrated. U.S. Pat. No. 6,750,912 to Tennant et al., which is incorporated herein by reference, describes the use of a dark pixel. Each photodiode generates charges upon exposure to light. Logic devices connected to the photodiode detect and amplify the charges to generate signals proportional to the incident light. Each pixel comprises at least one photodiode to covert incident photons into electrical charges.

During a read out of the charge from a photodiode, charge carriers stored in a charge collection well is transferred through a body of a transfer transistor to a floating drain. The transfer of the charge needs to be complete to maximize the signal strength from the pixel. Electrical charges remaining in the photodiode after the transfer of the charge through the transfer transistor causes "image lag" when the next image is taken by the photodiode. A photodiode that retains residual electrical charges from the prior exposure due to the incomplete transfer of the electrical charges thus imparts some of the image from the previous exposure to the image from the next exposure. Thus, the next image includes a component of the previous image through the image lag.

The image lag causes signal loss for a current image. Further, the image lag mixes the signals from the current exposure with the signals from the previous exposure, which is partially retained in the photodiode through the residual electrical charges in the photodiode after the incomplete charge transfer during the previous operation. The trapping of the residual charges in the photodiode is typically caused by a potential barrier between the charge collection well and the channel of the transfer transistor, which prevents transfer of all of the electrical charges during a read operation or a reset operation.

In view of the above, there exists a need for a CMOS image sensor structure that provides reduction of image lag. Particularly, there exists a need for a CMOS image sensor, that effects a complete transfer of electrical charges from the photodiode to the floating drain as quickly as possible, i.e., before the next image is taken.

SUMMARY OF THE INVENTION

To address the needs described above, the present invention provides a CMOS image sensor structure having a body with a tensile stress between a charge collection well of a photodiode and a floating drain to lower a potential barrier between the source region and the body, and methods of manufacturing the same.

In the present invention, a tensile-stress-generating structure is formed above a gate electrode in a CMOS image sensor to apply a normal tensile stress between a charge collection well of a photodiode, which is also a source region of a transfer transistor, and a floating drain in the direction connecting the source region and the floating drain. The tensile stress lowers the potential barrier between the source region and the body of the transfer transistor to effect a faster and more through transfer of the electrical charges in the source region to the floating drain. Image lag is thus reduced in the CMOS image sensor. Further, charge capacity of the source region is also enhanced due to the normal tensile stress applied to the source region.

According to an aspect of the present invention, a semiconductor structure is provided, which comprises:

a lightly-doped first conductivity type semiconductor layer containing a lightly-doped first conductivity type region and located in a semiconductor substrate;

a second conductivity type charge collection well vertically abutting the lightly-doped first conductivity type region;

a transfer transistor including a floating drain located in the semiconductor substrate, a gate dielectric vertically abutting a top surface of the lightly-doped first conductivity type semiconductor layer, and a gate electrode vertically abutting the gate dielectric, wherein the second conductivity type charge collection well is a source of the transfer transistor; and a tensile-stress-generating structure located on the gate electrode, wherein the tensile-stress-generating structure applies a normal tensile stress between the second conductivity type charge collection well and the floating drain in a direction connecting the second conductivity type charge collection well and the floating drain.

The semiconductor substrate may comprise a heavily-doped first conductivity type semiconductor layer abutting a bottom surface of the lightly-doped first conductivity type semiconductor layer. The floating drain is located above a first conductivity type well region. A surface pinning layer, which is a P+ surface doping layer, may be located on top of the second conductivity type charge collection well.

According to another aspect of the present invention, a method of forming a semiconductor structure is provided, which comprises:

forming a second conductivity type charge collection well directly above a lightly-doped first conductivity type region within a lightly-doped first conductivity type semiconductor layer in a semiconductor substrate;

forming a transfer transistor on the semiconductor substrate, wherein the transfer transistor comprises a floating drain formed in the semiconductor substrate, a gate dielectric formed directly on a top surface of the lightly-doped first conductivity type semiconductor layer, and a gate electrode formed directly on the gate dielectric, and wherein the second conductivity type charge collection well is a source of the transfer transistor; and forming a tensile-stress-generating structure on the gate electrode, wherein the tensile-stress-generating structure applies a normal tensile stress between the second conductivity type charge collection well and the floating drain in a direction connecting the second conductivity type charge collection well and the floating drain.

In one embodiment, the method further comprises:

forming a dielectric layer over the semiconductor substrate and the gate electrode; and anisotropically etching the dielectric layer, thereby forming a dielectric gate spacer laterally enclosing the gate electrode, and wherein the dielectric gate spacer constitutes the tensile-stress-generating structure.

In another embodiment, the method further comprises:

forming a tensile-stress-generating dielectric layer over the semiconductor substrate and the gate electrode;

removing a first portion of the tensile-stress-generating dielectric layer over the gate electrode and a second portion of the tensile-stress-generating dielectric layer over the floating drain;

forming a drain side metal semiconductor alloy portion directly on the floating drain; and forming a gate metal semiconductor alloy portion directly on the gate electrode.

In yet another embodiment, the method further comprises:

forming a drain side metal semiconductor alloy portion directly on the floating drain;

forming a gate metal semiconductor alloy portion directly on the gate electrode; and forming a tensile-stress-generating dielectric layer over the drain side metal semiconductor alloy portion and the gate metal semiconductor alloy portion.

According to yet another aspect of the present invention, a design structure embodied in a machine readable medium for designing, manufacturing, or testing a design, the design structure is provided. The design structure comprises:

a first data representing a lightly-doped first conductivity type semiconductor layer in a semiconductor substrate;

a second data representing a second conductivity type charge collection well located directly on the lightly-doped first conductivity type semiconductor layer, wherein the first data and the second data collectively represent a photodiode;

a third data representing a transfer transistor and including the second data and a fourth data representing a floating drain, which is a charge collection well, wherein the second conductivity type charge collection well constitutes a source of the transfer transistor; and a fifth data representing a tensile-stress-generating structure located on the transfer transistor and including a sixth data representing a body of the transfer transistor to which a normal tensile stress is applied in a direction connecting the second conductivity type charge collection well and the floating drain.

The design structure may further comprise:

a seventh data representing a heavily-doped first conductivity type semiconductor layer located directly underneath the lightly-doped first conductivity type semiconductor layer;

an eighth data representing a first conductivity type well region vertically abutting the floating drain and located in the semiconductor substrate and having a higher dopant concentration than the lightly-doped first conductivity type semiconductor layer; and a ninth data representing a surface pinning layer having a first conductivity type doping and located directly on a top surface of the second conductivity type charge collection well, wherein the surface pinning layer laterally abuts a sidewall of the second conductivity type charge collection well.

DETAILED DESCRIPTION OF THE INVENTION

Figure 1:
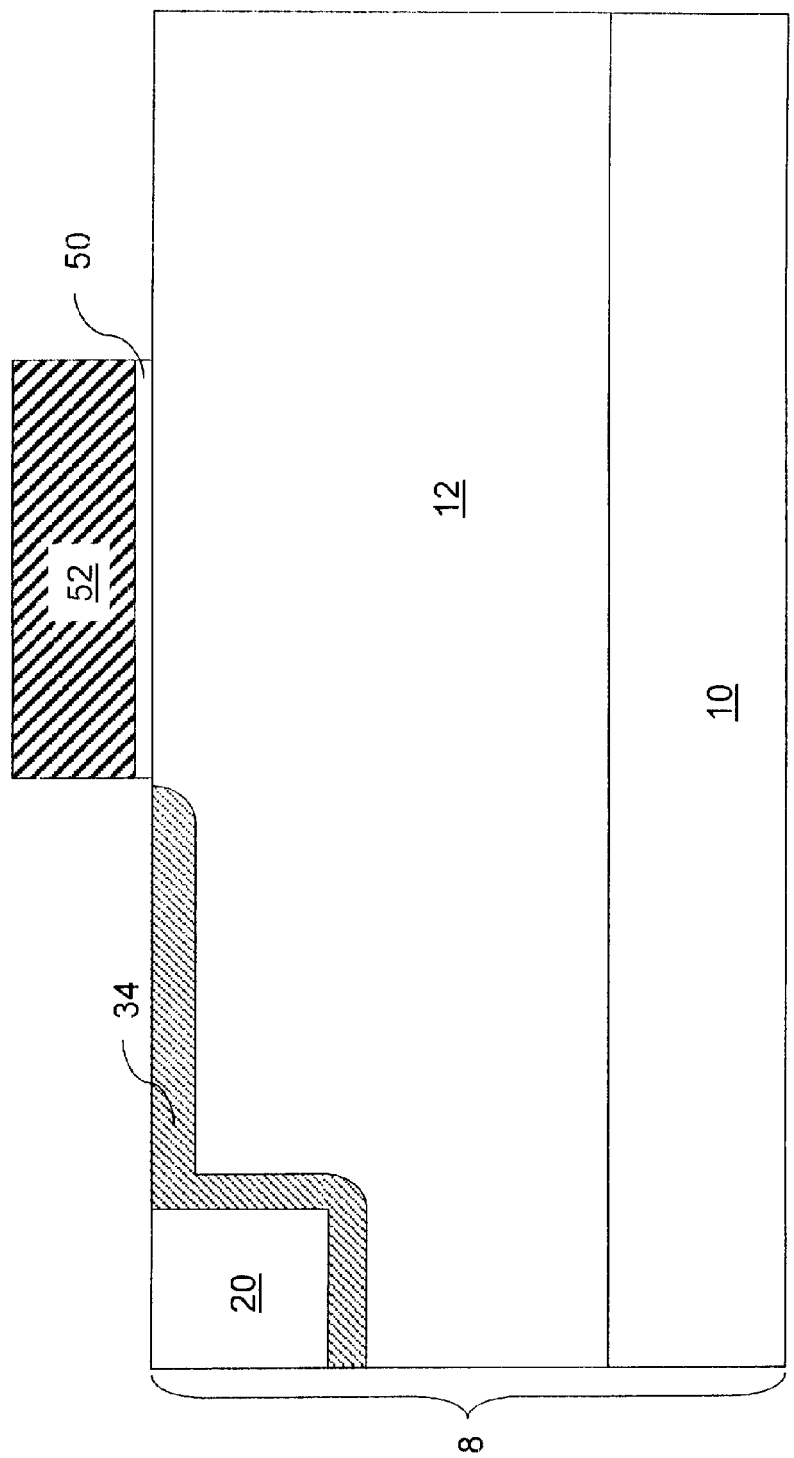
FIG. 1 is a vertical cross-sectional view of a first exemplary semiconductor structure for a CMOS image sensor pixel after patterning of a gate electrode according to a first embodiment of the present invention.

As stated above, the present invention relates to a complementary metal oxide semiconductor (CMOS) image sensor structure having reduced image lag and enhanced capacitance, and methods of manufacturing the same, which are now described in detail with accompanying figures. It is noted that like and corresponding elements are referred to by like names or reference numerals in the figures.

Referring to FIG. 1, a first exemplary semiconductor structure, which constitutes a portion of a CMOS image sensor pixel, includes a semiconductor substrate 8 and a transfer gate transistor formed thereupon. The semiconductor substrate 8 comprises a heavily-doped first conductivity type semiconductor layer 10, a lightly-doped first conductivity type semiconductor layer 12, and a shallow trench isolation structure 20. The semiconductor substrate 8 further comprises a surface pinning layer 34.

In the present invention, a lightly-doped semiconductor material denotes a semiconductor material having a dopant concentration less than or equal to $1.0 \times 10^{18}/cm^3$. A heavily-doped semiconductor material denotes a semiconductor material having a dopant concentration greater than $1.0 \times 10^{18}/cm^3$. A lightly-doped semiconductor layer denotes a layer of a lightly-doped semiconductor material. A heavily-doped semiconductor layer denotes a layer of a heavily-doped semiconductor material.

The heavily-doped semiconductor layer 10 comprises a heavily doped semiconductor material having a first conductivity type doping, i.e., has a doping concentration from about $1.0 \times 10^{18}/cm^3$ to about $1.0 \times 10^{21}/cm^3$, and typically from about $1.0 \times 10^{19}/cm^3$ to about $1.0 \times 10^{20}/cm^3$. The first conductivity type is p-type or n-type. The lightly-doped first conductivity type semiconductor layer 12 comprises a lightly-doped semiconductor material having the first conductivity type doping, which is a low concentration doping with first conductivity type dopants. For example, the lightly-doped first conductivity type semiconductor layer 12 may have a dopant concentration from about $1.0 \times 10^{14}/cm^3$ to about $1.0 \times 10^{18}/cm^3$, and typically from about $1.0 \times 10^{15}/cm^3$ to about $1.0 \times 10^{17}/cm^3$. Non-limiting examples of the semiconductor material that may constitute the heavily-doped semiconductor layer 10 and/or the lightly-doped semiconductor layer 12 include silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials. For example, silicon may be employed for the semiconductor material of the heavily-doped semiconductor layer 10 and/or the lightly-doped semiconductor layer 12. Preferably, the lightly-doped semiconductor layer 12 is single crystalline, i.e., the semiconductor material is epitaxially aligned atomically within the entirety of the lightly-doped semiconductor layer 12. More preferably, the heavily-doped semiconductor layer 10 and/or the lightly-doped semiconductor layer 12 are single crystalline, i.e., the semiconductor material is epitaxially aligned atomically within the entirety of the heavily-doped semiconductor layer 10 and the lightly-doped semiconductor layer 12.

The shallow trench isolation structure 20 is formed, for example, by formation of a dielectric pad layer (not shown) over the semiconductor substrate 8, application and lithographic patterning of a photoresist (not shown), an anisotropic etch that transfers the pattern in the photoresist into exposed portions of the lightly-doped first conductivity type semiconductor layer 12 to form a shallow trench, deposition of a dielectric material inside the shallow trench, and planarization of the dielectric material. The depth of the shallow trench isolation structure 20 may be from about 150 nm to about 600 nm, and typically from about 200 nm to about 500 nm, although lesser and greater thicknesses are also contemplated herein.

The surface pinning layer 34 has a doping of the first conductivity type. The surface pinning layer 34 is formed implanting first conductivity type dopants into the semiconductor substrate 8 between the formation of the shallow trench and the deposition of the dielectric material. Specifically, first conductivity type dopants, such as boron, gallium, and indium, are implanted into an upper region of the lightly-doped first conductivity type semiconductor layer 12 that includes sidewalls and a bottom surface of the shallow trench by a mask ion implantation. The implanted contiguous region constitutes a surface pinning layer 34 having a first conductivity type doping at a dopant concentration higher than the dopant concentration of the unimplanted portions of the lightly-doped first conductivity type semiconductor layer 12, i.e., higher than the dopant concentration of the lightly-doped first conductivity type semiconductor layer 12 prior to the implantation. The dopant concentration of the surface pinning layer 34 may be from about $1.0 \times 10^{17}/cm^3$ to about $1.0 \times 10^{21}/cm^3$, and typically from about $1.0 \times 10^{18}/cm^3$ to about $1.0 \times 10^{20}/cm^3$, although lesser and greater dopant concentrations are also explicitly contemplated herein. Typically, the surface pinning layer 34 is heavily-doped. The surface pinning layer 34 comprises a first horizontal portion vertically abutting a top surface of the semiconductor substrate 8, a vertical portion laterally abutting the shallow trench isolation structure 20, and a second horizontal portion vertically abutting a bottom surface of the shallow trench isolation structure 20.

The gate dielectric 50 may comprise a semiconductor oxide base dielectric material such as silicon oxide or silicon oxynitride, or may comprise a high-k material containing a metal and oxygen, and is known in the art as high-k gate dielectric materials. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2.

The gate electrode 52 may comprise a doped semiconductor material such as doped polysilicon or a doped silicon-germanium alloy, and/or may comprise a metallic material employed in a metal gate. The thickness of the gate electrode 52 may be from about 30 nm to about 300 nm, and typically from about 60 nm to about 200 nm. The length of the gate electrode 52, i.e., the lateral dimension of the gate electrode 52 in the plane of the vertical cross-sectional view of FIG. 1, may be from about 50 nm to about 1,000 nm, and typically from about 100 nm to about 500 nm.

The gate dielectric 50 and the gate electrode 52 are formed by deposition of a stack of a gate dielectric layer (not shown) and a gate electrode layer (not shown) followed by lithographic patterning of the stack. Thus, the sidewalls of the gate dielectric 50 and the gate electrode 52 are substantially vertically coincident.

Figure 2:
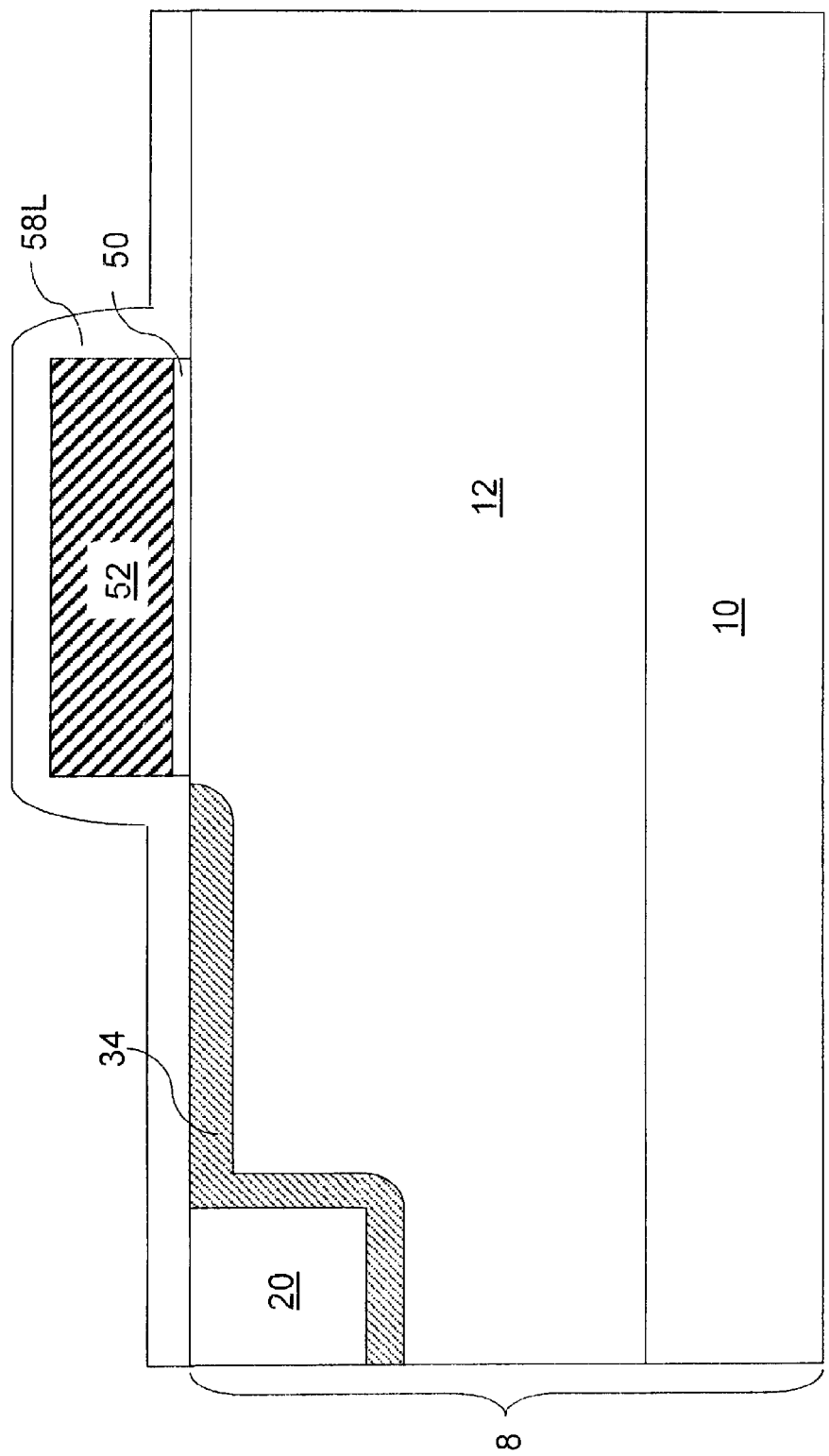
FIG. 2 is a vertical cross-sectional view of the first exemplary semiconductor structure after deposition of a dielectric layer according to the first embodiment of the present invention.

Referring to FIG. 2, a tensile-stress-generating dielectric layer 58L is formed directly on sidewalls of the gate electrode 52 and the top surface of the semiconductor substrate 8. The tensile-stress-generating dielectric layer 58L comprises a dielectric material that applies a tensile stress to the underlying structures including the gate electrode 52 and the semiconductor substrate 8. The tensile-stress-generating dielectric layer 58L may comprise any material that generates a tensile stress including silicon nitride.

The tensile-stress-generating dielectric layer 58L may be formed by low pressure chemical vapor deposition (LPCVD), rapid thermal chemical vapor deposition (RTCVD), plasma enhanced chemical vapor deposition (PECVD), high density plasma chemical vapor deposition (HDPCVD), etc. Preferably, the tensile-stress-generating dielectric layer 58L is formed by a conformal deposition, i.e., a deposition that deposits about the same amount of material on vertical surfaces as on horizontal surfaces. The thickness of the tensile-stress-generating dielectric layer 58L may be from about 10 nm to about 150 nm, and typically from about 25 nm to about 75 nm, although lesser and greater thicknesses are also contemplated herein.

Figure 3:
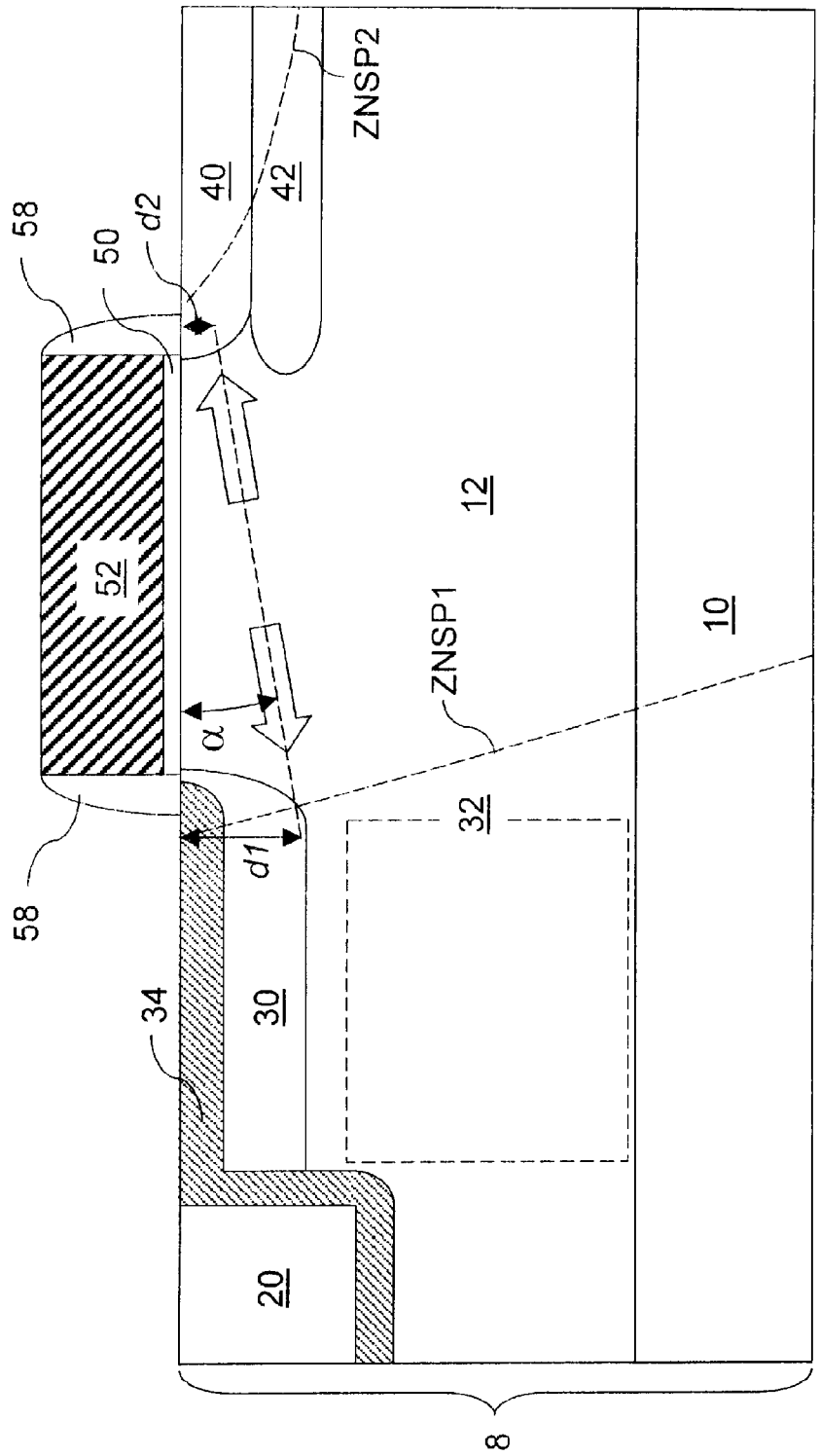
FIG. 3 is a vertical cross-sectional view of the first exemplary semiconductor structure after formation of a dielectric gate spacer according to the first embodiment of the present invention.
Figure 4:
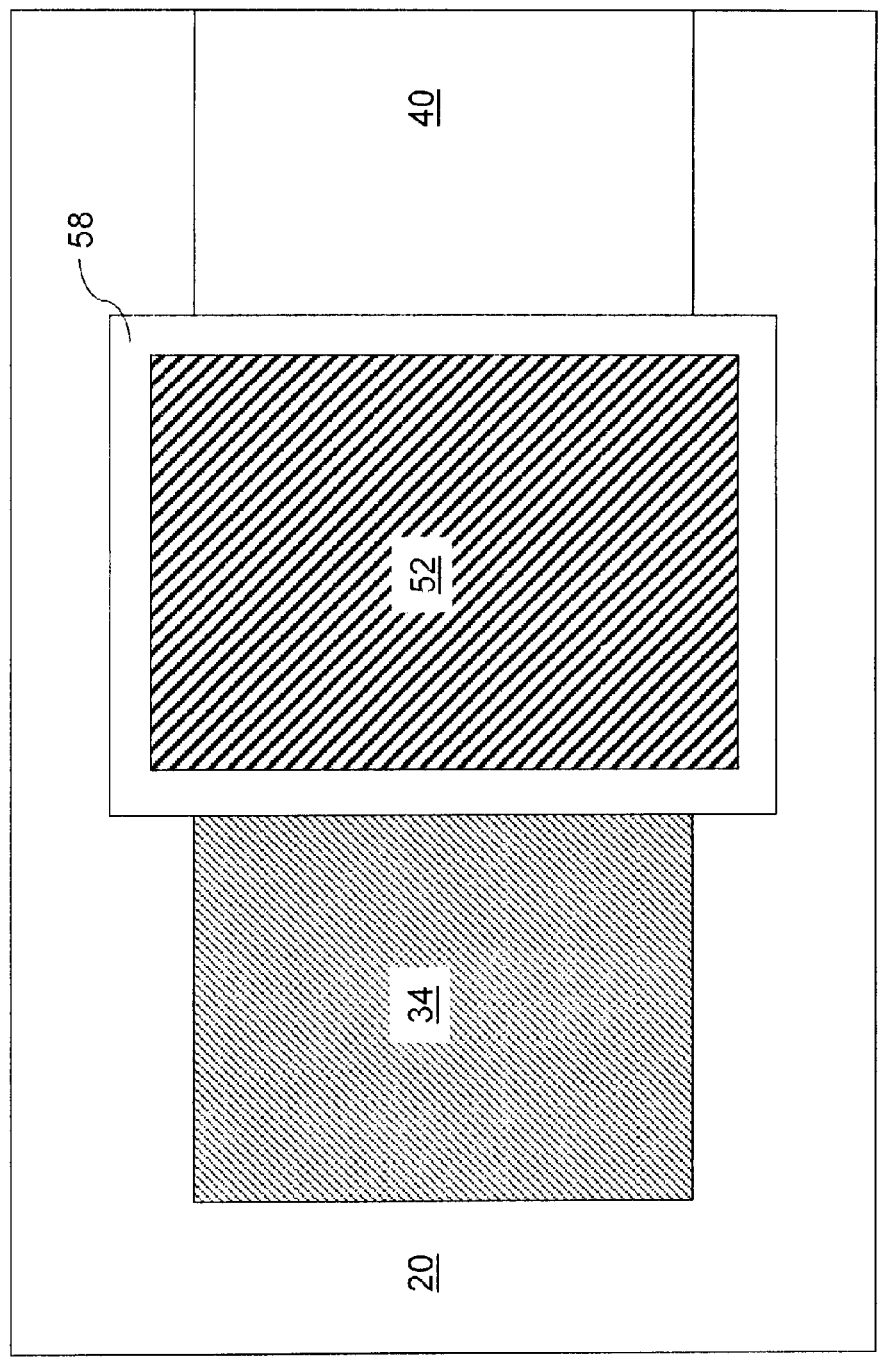
FIG. 4 is a top-down view of the first exemplary semiconductor structure of FIG. 3 according to the first embodiment of the present invention.

Referring to FIGS. 3 and 4, an anisotropic etch is performed to removed horizontal portions of the tensile-stress-generating dielectric layer 58L. Preferably, the anisotropic etch is selective to the semiconductor material of the semiconductor substrate 8, i.e., the semiconductor material of the lightly-doped first conductivity type semiconductor layer 12 and the surface pinning layer 34.

A vertical portion of the tensile-stress-generating dielectric layer 58L located on the sidewalls of the gate electrode 52, which remain after the anisotropic etch, constitutes a dielectric gate spacer 58. The width of the dielectric gate spacer 58, as measured at the base that abuts the semiconductor substrate 8, may be from about 10 nm to about 150 nm, and typically from about 25 nm to about 75 nm, although lesser and greater widths are also contemplated herein. The dielectric gate spacer 58 laterally encloses and surrounds the gate electrode 52, and applies a tensile stress to the gate electrode 52 and the underlying portion of the semiconductor substrate 8.

Employing the gate electrode 52 and the gate spacer 58 as a self-aligning implantation mask, second-conductivity-type dopants are implanted into the semiconductor substrate 8 to form a second conductivity type charge collection well 30 and a floating drain 40. The floating drain 40 functions as a charge collection well. Specifically, the second conductivity type charge collection well 30 is formed underneath the surface pinning layer 34 on one side of the gate electrode 52. The floating drain 40 is formed directly underneath a top surface of the semiconductor substrate 8 on an opposite side of the gate electrode 52. Also, first conductivity type dopants are implanted underneath the floating drain 40 to form a first conductivity type well region 42.

The second conductivity type charge collection well 30 is formed directly underneath the surface pinning layer 34 by a masked ion implantation of second conductivity type dopants. The dopant concentration of the second conductivity type charge collection well 30 may be from about $1.0 \times 10^{16}/cm^3$ to about $1.0 \times 10^{20}/cm^3$, and typically from about $1.0 \times 10^{17}/cm^3$ to about $1.0 \times 10^{19}/cm^3$, although lesser and greater dopant concentrations are also explicitly contemplated herein. The second conductivity type charge collection well 30 functions as a source of the transfer transistor. The depth of the second conductivity type charge collection well 30, as measured between the top surface of the semiconductor substrate 8 and a flat portion of the bottom surface of the second conductivity type charge collection well 30, may be from about 50 nm to about 500 nm, and typically from about 100 nm to about 400 nm, although lesser and greater depths are also contemplated herein.

The portion of the lightly-doped first conductivity type semiconductor layer 12 located directly underneath the second conductivity type charge collection well 30 is herein referred to as a lightly-doped first conductivity type region 32. The lightly-doped first conductivity type region 32 is laterally confined between the sidewall of the vertical portion of the surface pinning layer 34 and the edge of the second conductivity type charge collection well 30 directly underneath the gate dielectric 50. The lightly-doped first conductivity type region 32 is a portion of the lightly-doped first conductivity type semiconductor layer 12, and has the same dopant concentration as the rest of the lightly-doped first conductivity type semiconductor layer 12. The thickness of the lightly-doped first conductivity type region 32 depends on the thickness of the lightly-doped first conductivity type semiconductor layer 12 as measured underneath the gate dielectric 50 and the depth of the second conductivity type charge collection well 30, and may be from about 500 nm to about 5,000 nm, and typically from about 1,000 nm to about 3,000 nm.

The floating drain 40 has a second conductivity type doping, and is electrically floating when the transfer transistor is turned off to enable storage of electrical charges. Preferably, separate implantation masks are employed to independently control the depth of the second conductivity type charge collection well 30 and the depth of the floating drain 40. Preferably, the depth of the floating drain 40 is less than the depth of the second conductivity type charge collection well 30. The dopant concentration of the floating drain 40 may be from about $1.0 \times 10^{17}/cm^3$ to about $1.0 \times 10^{21}/cm^3$, and typically from about $1.0 \times 10^{18}/cm^3$ to about $1.0 \times 10^{20}/cm^3$, although lesser and greater dopant concentrations are also explicitly contemplated herein. The depth of the floating drain 40, as measured between the top surface of the semiconductor substrate 8 and a flat portion of the bottom surface of the floating drain 40, may be from about 30 nm to about 300 nm, and typically from about 60 nm to about 300 nm, although lesser and greater depths are also contemplated herein.

The first conductivity type well region 42 is formed by implantation of first conductivity type dopants under the floating drain 40. The first conductivity type well region 42 collects charge carrier of the first conductivity type from the body of the transfer transistor, which is a portion of the lightly-doped first conductivity type semiconductor layer 12 located underneath the gate dielectric 50. The first conductivity type well region 42 has a higher dopant concentration than the lightly-doped first conductivity type semiconductor layer 12. The dopant concentration of the first conductivity type well region 42 may be $1.0 \times 10^{16}/cm^3$ to about $5.0 \times 10^{19}/cm^3$, and typically from about $3.0 \times 10^{17}/cm^3$ to about $3.0 \times 10^{18}/cm^3$, although lesser and greater dopant concentrations are also explicitly contemplated herein.

The lightly-doped first conductivity type region 32 and the second conductivity type charge collection well 30 collectively constitute a photodiode (32, 30) that generates electron-hole pairs. Charge carriers of the second conductivity type are collected in the second conductivity type charge collection well 30 in proportion to the amount of photons impinging into the photodiode (32, 30). In case the first conductivity type is p-type and the second conductivity type is n-type, electrons are collected in the second conductivity type charge collection well 30. In case the second conductivity type is n-type and the second conductivity type is p-type, holes are collected in the second conductivity type charge collection well 30. A photon impinging on the photodiode (32, 30) generates an electron-hole pair if the photon interacts with the semiconductor material in the photodiode (32, 30). The energy of the photon that induces electron-hole pair generation depends on the type of the semiconductor material in the semiconductor substrate 8, but the wavelength range of photons for the photogeneration of an electron-hole pair is from about 190 nm to about 1,100 nm for silicon, from about 400 nm to about 1,700 nm for germanium, and from about 800 nm to about 2,600 nm for indium gallium arsenide, respectively.

If the electron-hole pair is generated within the depletion region of the photodiode (32, 30), the charge carriers (holes and electrons) drift apart due to the kinetic energy imparted to the charge carriers during the photogeneration process. If a minority carrier (a charge carrier of the first conductivity type in the second conductivity type charge collection well 30 or a charge carrier of the second conductivity type in the lightly-doped first conductivity type region 32) enters into the depletion region by drifting, the electric field inherent in the depletion region of the photodiode (32, 30) sweeps the carrier across the p-n junction, which then becomes a majority carrier, i.e., a charge carrier of the first conductivity type in the lightly-doped first conductivity type region 32 or a charge carrier of the second conductivity type in the second conductivity type charge collection well 30, upon crossing the p-n junction, and producing a photocurrent if the circuit is closed, or accumulates charges. Particularly, if the carrier is a carrier of the second conductivity type, the carrier accumulates in the second conductivity type charge collection well 30. The amount of charge that accumulates in the second conductivity type charge collection well 30 is nearly linear to the number of incident photons (assuming the photons have the same energy distribution). If the minority carrier recombines with the majority carriers within the photodiode (32, 30) prior to entering the depletion region, the minority carrier is "lost" through recombination and no current or charge accumulation results.

The transfer gate transistor is integrally formed with the photodiode (30, 32) such that the second conductivity type charge collection well 30, which comprises a heavily-doped second conductivity type semiconductor material, is also a source of the transfer gate transistor. Charge carriers of the second conductivity type, i.e., electrons if the second conductivity type is n-type or holes if the second conductivity type is p-type, accumulate in the second conductivity type charge collection well 30 when photons are incident on the photodiode (32,30). When the transfer transistor is turned on, the charge carriers in the second conductivity type charge collection well 30 are transferred into the floating drain 40, which is a charge collection well and stores electrical charge from the photodiode (30, 32) as data until a read circuit detects the amount of stored charge. Thus, the second conductivity type charge collection well 30 functions as the source of the transfer transistor while the transfer transistor is turned on.

The stress field in the semiconductor substrate 8 is asymmetric about the gate electrode 52, however, due to the tensile stress generated by the shallow trench isolation structure 20. Particularly, the shallow trench isolation structure 20 is located closer to one side of the gate electrode 52, i.e., the side containing the second conductivity type charge collection well 30 and than to the side containing the floating drain 40. The tensile stress generated by the dielectric gate spacer 58 and the tensile stress generated by the shallow trench isolation structure 20 are combined to generate the asymmetric tensile stress between the two zero-normal-stress planes represented by two dotted lines and encompassing a body portion of the transfer transistor. Notably, a first zero-normal-stress plane ZNSP1 tilts toward the floating drain 40 with increasing depth from the top surface of the semiconductor substrate 8. A second zero-normal-stress plane ZNSP2 tilts away from the second conductivity type charge collection well 30 with increasing depth from the top surface of the semiconductor substrate 8.

In other words, the dielectric gate spacer 58 generates normal tensile stress between the lightly-doped first conductivity type region 32 and the floating drain 40, and the shallow trench isolation structure 20 generates an additional normal tensile stress between the second conductivity type charge collection well 30 and the floating drain 40. Normal stress herein refers to diagonal components of stress, or the component of stress applied perpendicular to a surface. The normal stress contrasts with sheet stress, which is a component of the stress applied tangential to the surface. The two types of normal tensile stresses add to generate a composite normal tensile stress in the body of the transfer transistor. The composite normal tensile stress has a vertically compressive component and a horizontally compressive component. The direction of the composite normal tensile stress is schematically shown by two arrows in FIG. 3.

The angle α between a bottom surface of the gate dielectric 50 and the direction of the composite normal tensile stress is non-zero. As a consequence, if the direction of the composite normal tensile stress is extended from underneath the gate dielectric 50 into the second conductivity type charge collection well 30 and the floating drain 40, a first end of the extension into the second conductivity type charge collection well 30 and a second end of the extension into the floating drain 40 have different depths. The first end has a first depth d1 and the second end has a second depth d2, in which the first depth d1 is greater than the second depth d2.

Figure 5:
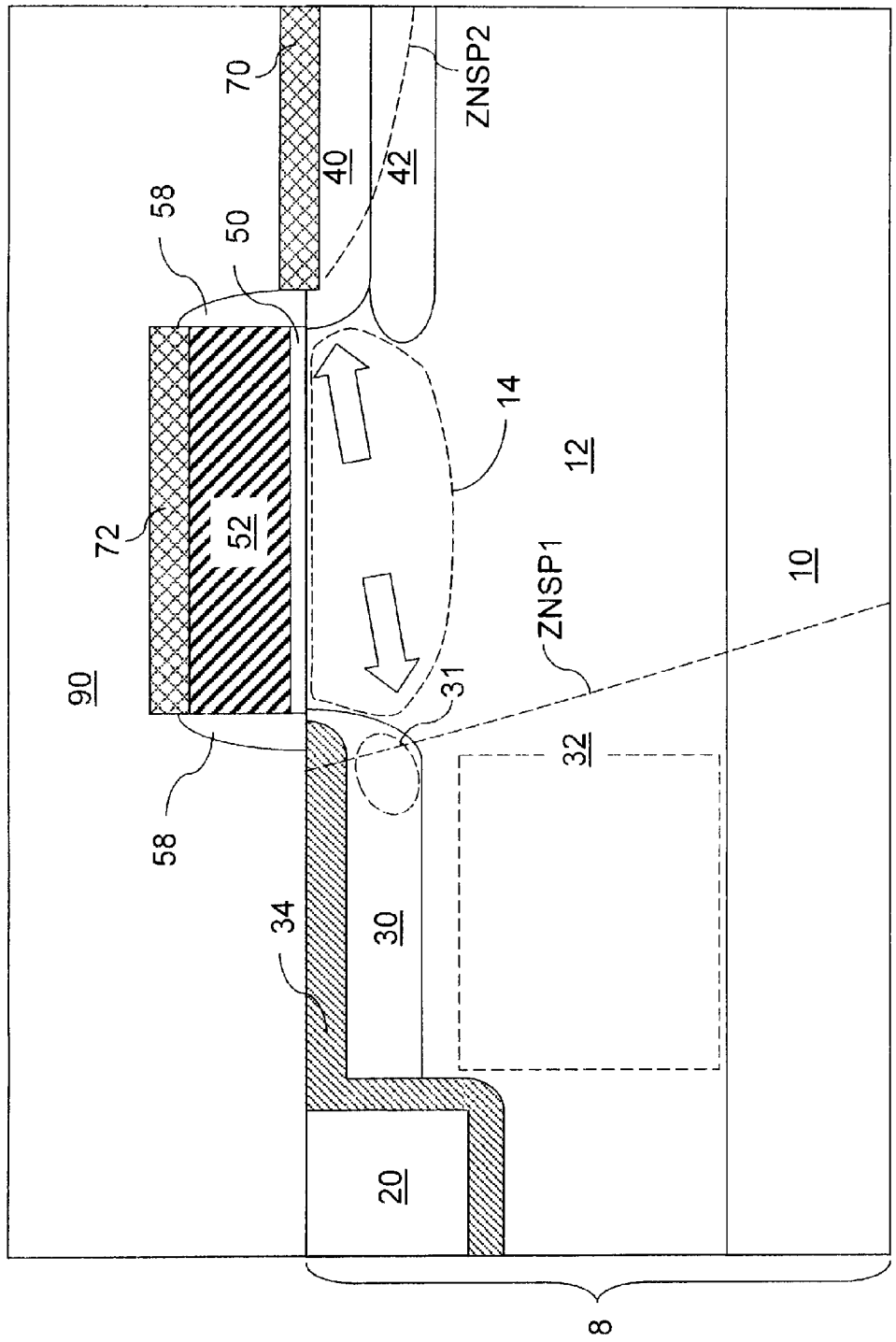
FIG. 5 is a vertical cross-sectional view of the first exemplary semiconductor structure after formation of metal semiconductor alloy portions and a middle-of-line (MOL) dielectric layer according to the first embodiment of the present invention.

Referring to FIG. 5, a drain side metal semiconductor alloy portion 70 and a gate metal alloy portion 72 are formed by metallization of the semiconductor material of the floating drain 40 and the gate electrode 52, respectively. Specifically, a metal layer is deposited over the semiconductor substrate 8 and the gate electrode 52, and is reacted with the underlying semiconductor material to form the various metal semiconductor alloy portions (70, 72). Unreacted portions of the metal layer are subsequently removed. If the semiconductor material of the semiconductor substrate 8 and/or the gate electrode 52 comprise silicon, the drain side metal semiconductor alloy portion 70 and/or the gate metal alloy portion 72 comprise a metal silicide.

A middle-of-line (MOL) insulator layer 90 is deposited over the various metal semiconductor alloy portions (70, 72), the dielectric gate spacer 58, the surface pinning layer 34, and the shallow trench isolation structure 20. The MOL insulator layer 90 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL insulator layer 90 may be from about 200 nm to about 500 nm. Alternately, the MOL insulator layer 90 may comprise an organosilicate glass (OSG) having a dielectric constant value of less than 2.8. The MOL insulator layer 90 is preferably planarized, for example, by chemical mechanical polishing (CMP). Alternately, the MOL insulator layer 90 may be a self-planarizing material such as a spin-on glass (SOG) or a spin-on low-k dielectric material such as SiLK™.

The composite normal tensile stress has an advantageous effect of lowering potential barrier between the second conductivity type charge collection well 30 and the body 14 of the transfer transistor. Such reduction of the potential barrier is effected by alteration of a band gap structure the semiconductor material comprising the lightly-doped first conductivity type semiconductor layer 12. Particularly, the band gap of the lightly-doped first conductivity type semiconductor layer 12 is reduced for charge carriers traveling in the direction of the composite normal tensile stress from the second conductivity type charge collection well 30 to the floating drain 40.

In the prior art, the potential barrier between a second conductivity type charge collection well and a body of a transistor is significant, and has an adverse effect of leaving charges, i.e., electrons or holes, at a corner region of the second conductivity type charge collection well abutting the body. According to the present invention, the charge carriers are almost completely depleted from a corner region 31 of the second conductivity type charge collection well 30 and flow through the body 14 into the floating drain 40 while the transfer transistor is turned on because the composite normal tensile stress lowers the potential barrier between the second conductivity type charge collection well 30 and the body 14. By reducing the residual charges in the second conductivity type charge collection well 30 through the reduction of the potential barrier, the present invention reduces image lag of the image pixel comprising the photodiode (32, 30) and the transfer transistor. Further, the composite normal tensile stress increases the speed of transfer of the charge carriers from the second conductivity type charge collection well 30 to the floating drain 40 since the mobility of the charge carriers is enhanced along the direction of the composite normal tensile stress.

The composite normal tensile stress has a further advantageous effect of increasing the charge capacity of the second conductivity type charge collection well 30, i.e., allowing the second conductivity type charge collection well 30 to hold more charge carriers. Thus, the dynamic range of the signal from the photodiode (32, 30) is enhanced relative to prior art image sensors that do not have such composite normal tensile stress.

Figure 6:
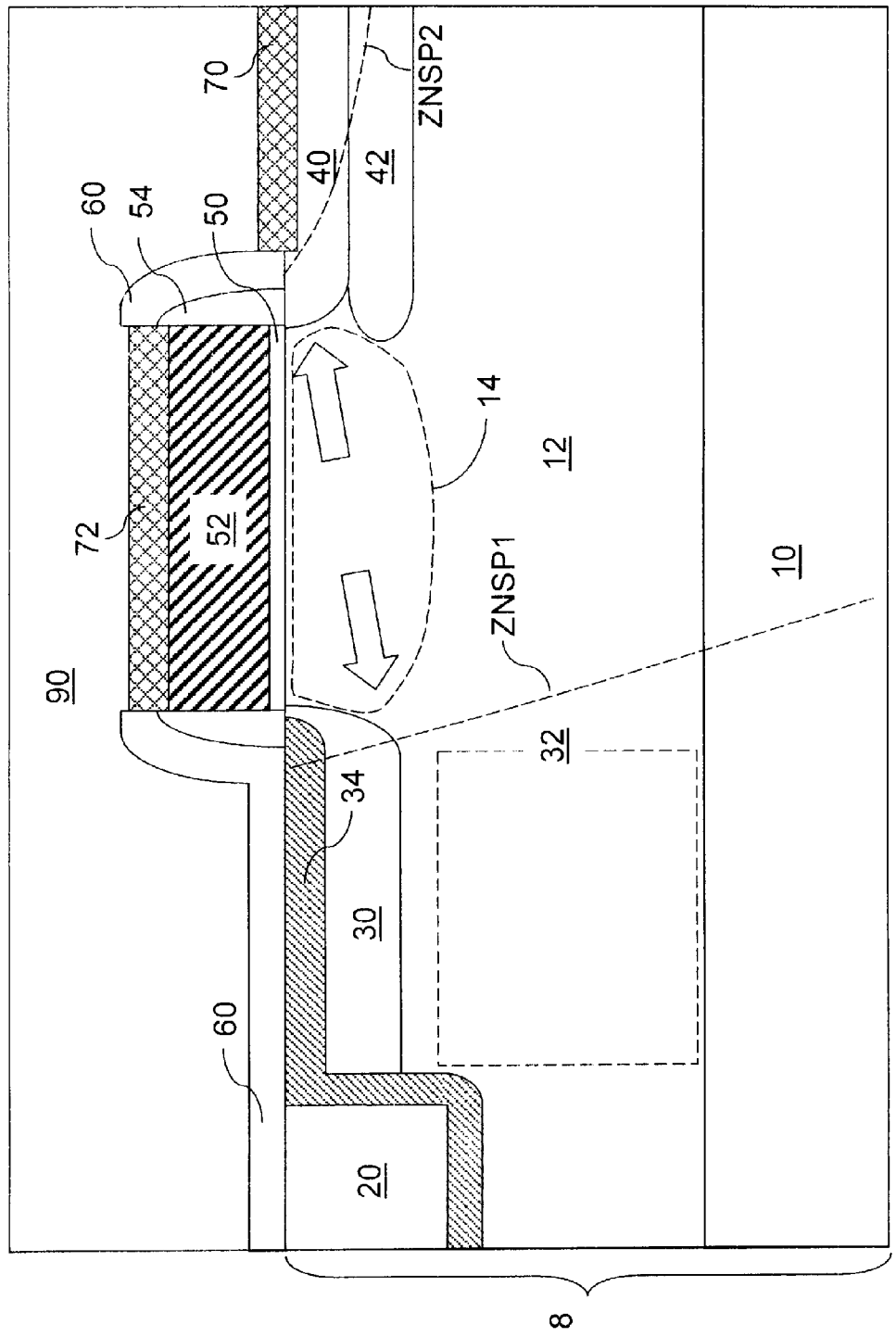
FIG. 6 is a vertical cross-sectional view of a second exemplary semiconductor structure according to a second embodiment of the present invention.
Figure 7:
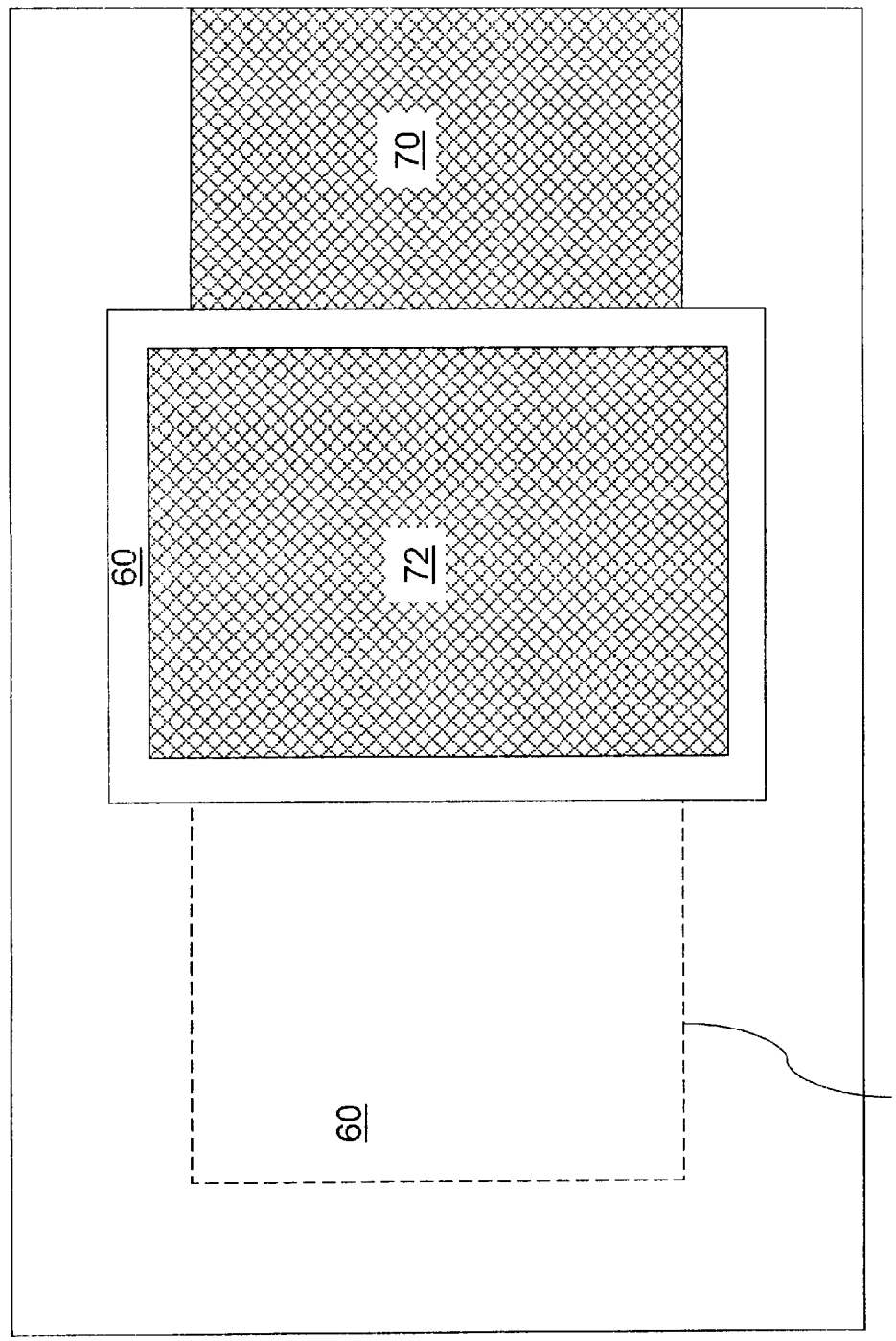
FIG. 7 is a top-down view of the second exemplary semiconductor structure of FIG. 6 according to the second embodiment of the present invention.

Referring to FIGS. 6 and 7, a second exemplary semiconductor structure according to a second embodiment of the present invention is derived from the first exemplary semiconductor structure of FIG. 1 by forming a dielectric gate spacer 54, which may, or may not, apply a tensile stress to the body 14 of the transfer transistor. The dielectric gate spacer 54 of the second exemplary semiconductor structure may be formed by the same methods as the dielectric gate spacer 58 of the first exemplary semiconductor structure. In case the dielectric gate spacer 54 comprises a tensile-stress-generating material, the dielectric gate spacer 54 may be formed in the same manner the dielectric gate spacer 58 of the first embodiment.

Each of the second conductivity type charge collection well 30, the floating drain 40, and the first conductivity type well region 42 has the same structural and compositional characteristics, and may be formed by the same methods, as in the first embodiment.

A tensile-stress-generating dielectric layer 60 is formed directly on the gate electrode 52, the dielectric gate spacer 54, and the exposed surface of the semiconductor substrate 8 including a top surface of the surface pinning layer 34 and a top surface of the floating drain 40. The tensile-stress-generating dielectric layer 60 comprises a dielectric material that applies a tensile stress to the underlying structures including the gate electrode 52 and the semiconductor substrate 8. The tensile-stress-generating dielectric layer 60 may comprise any material that generates a tensile stress including silicon nitride.

The tensile-stress-generating dielectric layer 60 may be formed by the same methods as the tensile-stress-generating dielectric layer 58L of the first embodiment. The thickness of the tensile-stress-generating dielectric layer 60 may be from about 10 nm to about 150 nm, and typically from about 25 nm to about 75 nm, although lesser and greater thicknesses are also contemplated herein.

The tensile-stress-generating dielectric layer 60 is patterned to expose the top surface of the gate electrode 52 and the top surface of the floating drain 40. A drain side metal semiconductor alloy portion 70 and a gate metal alloy portion 72 are formed by metallization of the semiconductor material of the floating drain 40 and the gate electrode 52, respectively. A middle-of-line (MOL) insulator layer 90 is deposited over the various metal semiconductor alloy portions (70, 72) and the tensile-stress-generating dielectric layer 60. The MOL insulator layer 90 may have the same structural and compositional characteristics as in the first embodiment.

As in the first embodiment, the lightly-doped first conductivity type region 32 and the second conductivity type charge collection well 30 collectively constitute a photodiode (32, 30) that generates electron-hole pairs. The stress field in the semiconductor substrate 8 is asymmetric about the gate electrode 52 due to the tensile stress generated by the shallow trench isolation structure 20 and the asymmetry of the tensile-stress-generating dielectric layer 60 about the gate electrode. The tensile-stress-generating dielectric layer 60 is present over the photodiode (32, 30), but is not present over most of the floating drain 40, i.e., over the area of the drain side metal semiconductor alloy portion 70.

The tensile stress generated by the tensile-stress-generating dielectric layer 60 and the tensile stress generated by the shallow trench isolation structure 20 are combined to generate the asymmetric tensile stress between the two zero-normal-stress planes represented by two dotted lines and encompassing a body portion of the transfer transistor. Notably, a first zero-normal-stress plane ZNSP1 tilts toward the floating drain 40 with increasing depth from the top surface of the semiconductor substrate 8. A second zero-normal-stress plane ZNSP2 tilts away from the second conductivity type charge collection well 30 with increasing depth from the top surface of the semiconductor substrate 8.

The composite normal tensile stress has the same effect on the charge carrier mobility as in the first embodiment. Thus, the potential barrier between the second conductivity type charge collection well 30 and the body 14 of the transfer transistor is lowered, and the band gap of the lightly-doped first conductivity type semiconductor layer 12 is reduced for charge carriers traveling in the direction of the composite normal tensile stress from the second conductivity type charge collection well 30 to the floating drain 40. Further, the charge capacity of the second conductivity type charge collection well 30 is increased, and the dynamic range of the signal from the photodiode (32, 30) is enhanced relative to prior art image sensors that do not have such composite normal tensile stress.

Figure 8:
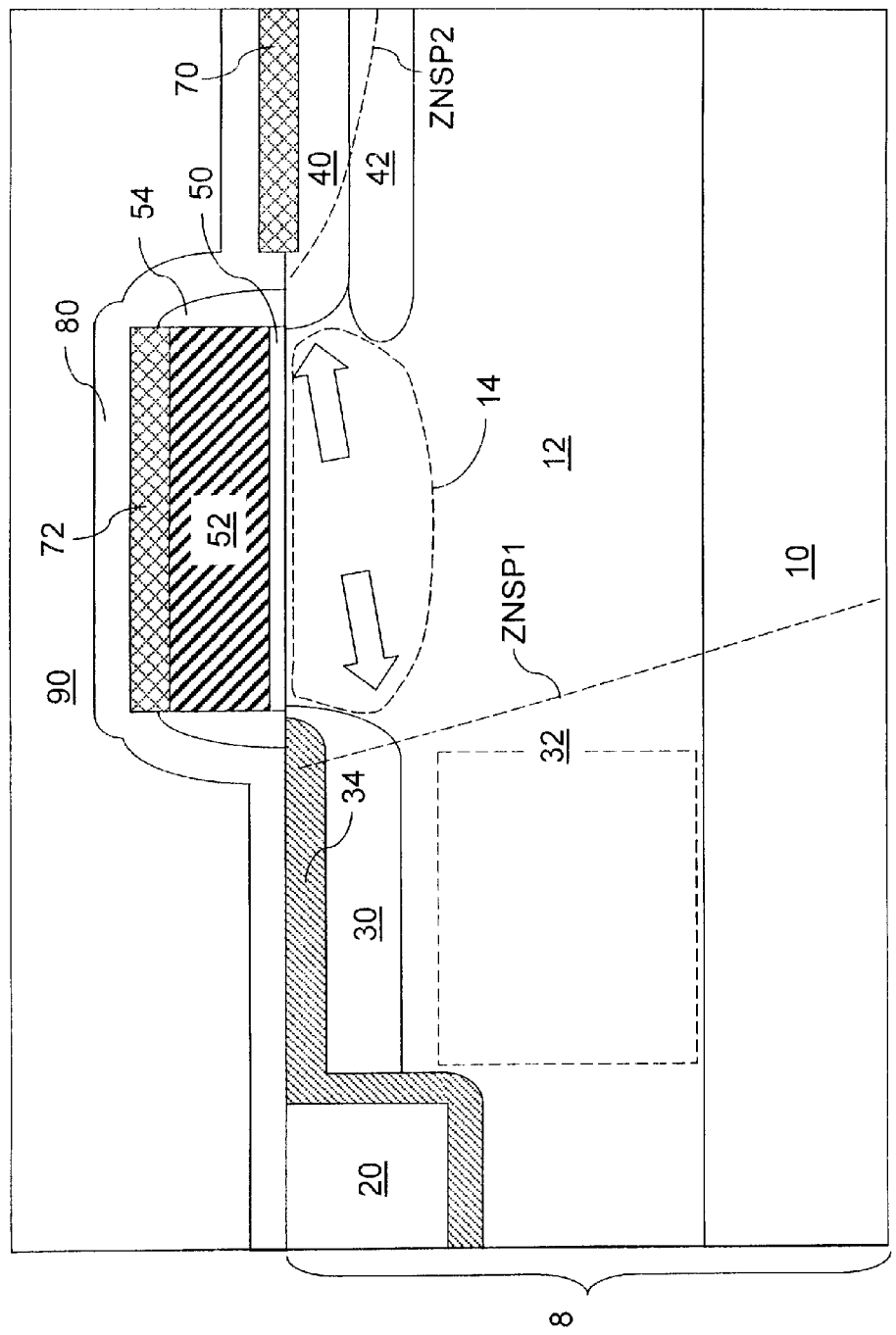
FIG. 8 is a vertical cross-sectional view of a third exemplary semiconductor structure according to a third embodiment of the present invention.
Figure 9:
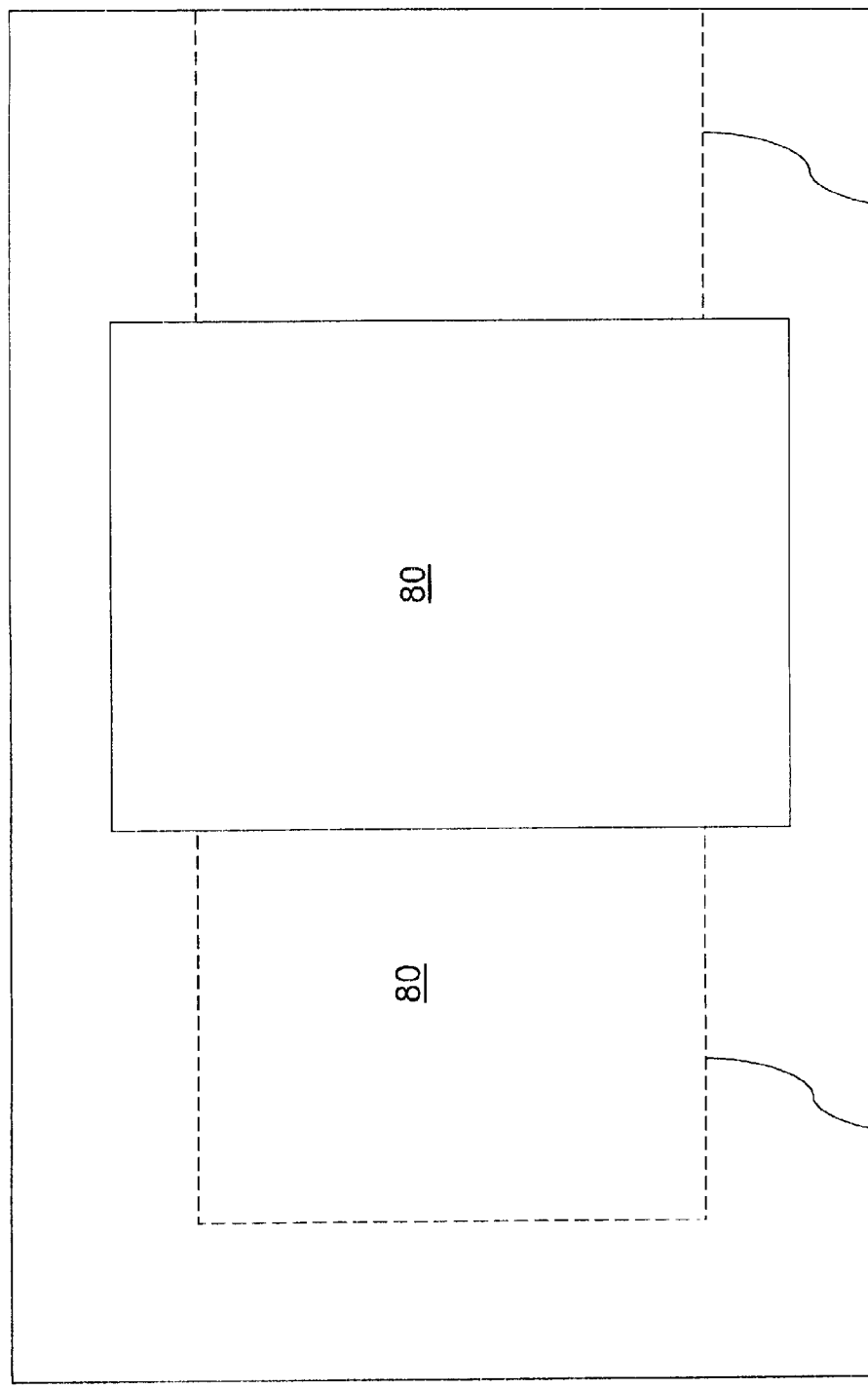
FIG. 9 is a top-down view of the third exemplary semiconductor structure of FIG. 8 according to the third embodiment of the present invention.

Referring to FIGS. 8 and 9, a third exemplary semiconductor structure according to a third embodiment of the present invention is derived from the first exemplary semiconductor structure of FIG. 1 by forming a dielectric gate spacer 54, which may, or may not, apply a tensile stress to the body 14 of the transfer transistor. The dielectric gate spacer 54 of the third exemplary semiconductor structure may be formed by the same methods as the dielectric gate spacer 58 of the first exemplary semiconductor structure. In case the dielectric gate spacer 54 comprises a tensile-stress-generating material, the dielectric gate spacer 54 may be formed in the same manner the dielectric gate spacer 58 of the first embodiment.

Each of the second conductivity type charge collection well 30, the floating drain 40, and the first conductivity type well region 42 has the same structural and compositional characteristics, and may be formed by the same methods, as in the first embodiment.

A dielectric material layer (not shown) is formed and patterned to mask the surface pinning layer 34, while exposing the gate electrode 52 and the floating drain 40. A drain side metal semiconductor alloy portion 70 and a gate metal alloy portion 72 are formed by metallization of the semiconductor material of the floating drain 40 and the gate electrode 52, respectively.

A tensile-stress-generating dielectric layer 80 is formed directly on the drain side metal semiconductor alloy portion 70, the gate metal alloy portion 72, the dielectric gate spacer 54, and the exposed surface of the semiconductor substrate 8 including a top surface of the surface pinning layer 34 and a top surface of the shallow trench isolation structure 20. The tensile-stress-generating dielectric layer 80 comprises a dielectric material that applies a tensile stress to the underlying structures including the gate electrode 52 and the semiconductor substrate 8. The tensile-stress-generating dielectric layer 80 may comprise any material that generates a tensile stress including silicon nitride.

The tensile-stress-generating dielectric layer 80 may be formed by the same methods as the tensile-stress-generating dielectric layer 58L of the first embodiment. The thickness of the tensile-stress-generating dielectric layer 80 may be from about 10 nm to about 150 nm, and typically from about 25 nm to about 75 nm, although lesser and greater thicknesses are also contemplated herein.

A middle-of-line (MOL) insulator layer 90 is deposited over the tensile-stress-generating dielectric layer 80. The MOL insulator layer 90 may have the same structural and compositional characteristics as in the first embodiment.

As in the first embodiment, the lightly-doped first conductivity type region 32 and the second conductivity type charge collection well 30 collectively constitute a photodiode (32, 30) that generates electron-hole pairs. The stress field in the semiconductor substrate 8 is asymmetric about the gate electrode 52 due to the tensile stress generated by the shallow trench isolation structure 20.

The tensile stress generated by the tensile-stress-generating dielectric layer 80 and the tensile stress generated by the shallow trench isolation structure 20 are combined to generate the asymmetric tensile stress between the two zero-normal-stress planes represented by two dotted lines and encompassing a body portion of the transfer transistor. Notably, a first zero-normal-stress plane ZNSP1 tilts toward the floating drain 40 with increasing depth from the top surface of the semiconductor substrate 8. A second zero-normal-stress plane ZNSP2 tilts away from the second conductivity type charge collection well 30 with increasing depth from the top surface of the semiconductor substrate 8.

The composite normal tensile stress has the same effect on the charge carrier mobility as in the first embodiment. Thus, the potential barrier between the second conductivity type charge collection well 30 and the body 14 of the transfer transistor is lowered, and the band gap of the lightly-doped first conductivity type semiconductor layer 12 is reduced for charge carriers traveling in the direction of the composite normal tensile stress from the second conductivity type charge collection well 30 to the floating drain 40. Further, the charge capacity of the second conductivity type charge collection well 30 is increased, and the dynamic range of the signal from the photodiode (32, 30) is enhanced relative to prior art image sensors that do not have such composite normal tensile stress.

Figure 10:
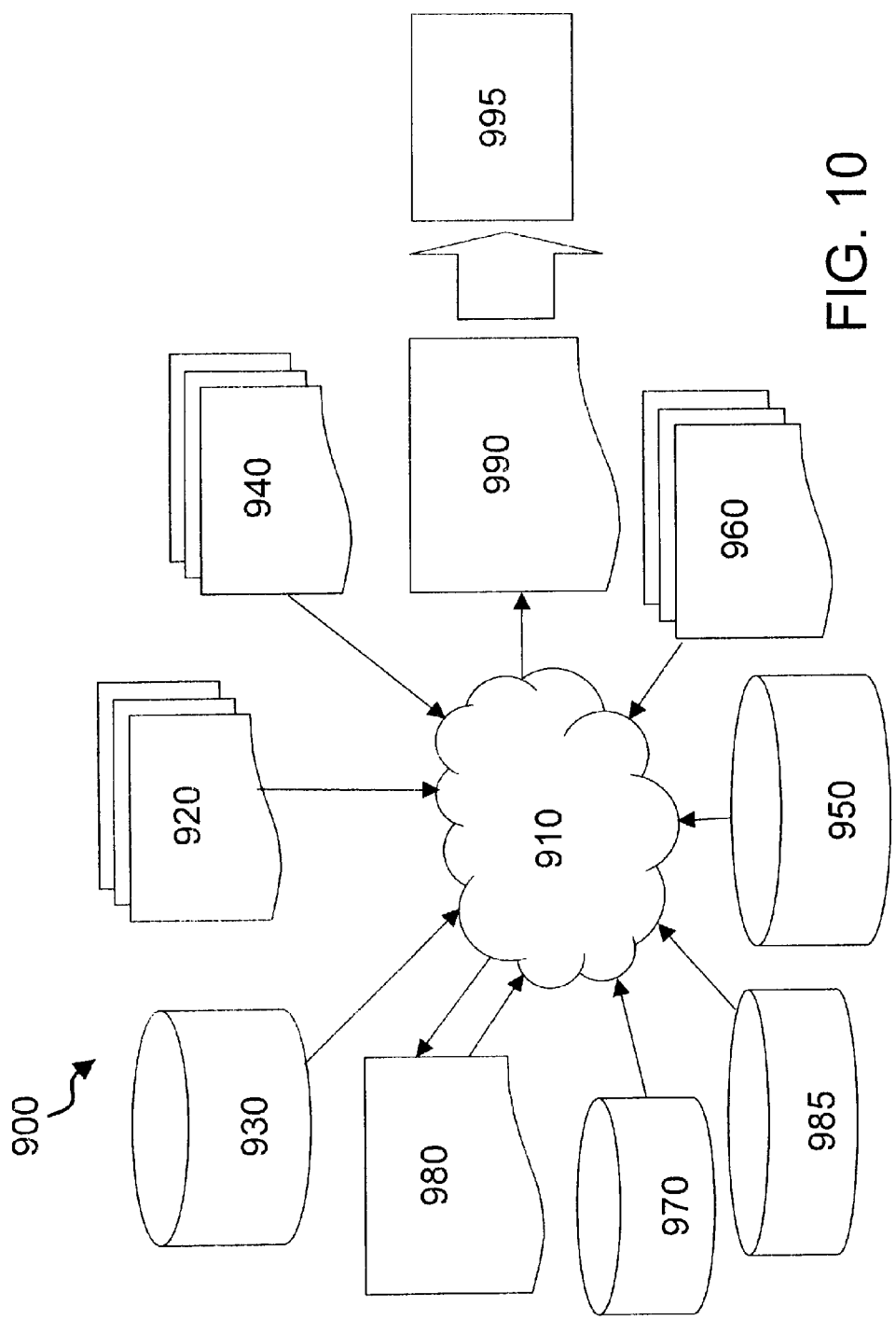
FIG. 10 is a flow diagram of a design process used in semiconductor design and manufacture of the semiconductor structure according to the present invention.

FIG. 10 shows a block diagram of an exemplary design flow 900 used for example, in semiconductor design and manufacturing of semiconductor devices employing the inventive semiconductor structure of the present invention described above. Design flow 900 may vary depending on the type of IC being designed. For example, a design flow for building an application specific integrated circuit (ASIC) may differ from a design flow for designing a standard integrated circuit component. Design structure 920 is preferably an input to a design process 910 and may come from an intellectual property (IP) provider, a core developer, or a design company, or may be generated by the operator of a design flow, or may come from other sources.

Design structure 920 comprises an embodiment of present invention as shown in FIGS. 3-9 in the form of schematics or HDL, hardware description language (e.g. Verilog, VHDL, C, etc.). The design structure 920 may be contained on one or more machine readable medium. For example, design structure 920 may be a text file or a graphical representation of an embodiment of the inventive structures of the present invention described above.

Design process 910 preferably synthesizes (or translates) an embodiment of the invention as show in FIGS. 3-10 into a netlist 980, where the netlist 980 is, for example, photodiodes, tensile-stress-generating structures, transfer transistors, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

According to the present invention, the design structure 920 may be embodied in a machine readable medium for designing, manufacturing, or testing a design, and may comprise:

a first data representing a lightly-doped first conductivity type semiconductor layer in a semiconductor substrate;

a second data representing a second conductivity type charge collection well located directly on the lightly-doped first conductivity type semiconductor layer, wherein the first data and the second data collectively represent a photodiode;

a third data representing a transfer transistor and including the second data and a fourth data representing a floating drain, wherein the second conductivity type charge collection well constitutes a source of the transfer transistor;

a fifth data representing a tensile-stress-generating structure located on the transfer transistor and including a sixth data representing a body of the transfer transistor to which a normal tensile stress is applied in a direction connecting the second conductivity type charge collection well and the floating drain, wherein the third data further includes a seventh data representing a gate dielectric vertically abutting a top surface of the lightly-doped first conductivity type semiconductor layer and an eighth data representing a gate electrode vertically abutting the gate dielectric;

a ninth data representing a heavily-doped first conductivity type semiconductor layer located directly underneath the lightly-doped first conductivity type semiconductor layer;

a tenth representing a first conductivity type well region vertically abutting the floating drain and located in the semiconductor substrate and having a higher dopant concentration than the lightly-doped first conductivity type semiconductor layer; and an eleventh data representing a surface pinning layer having a first conductivity type doping and located directly on a top surface of the second conductivity type charge collection well, wherein the surface pinning layer laterally abuts a sidewall of the second conductivity type charge collection well.

It is noted herein that the lightly-doped first conductivity type region 32 as physically manifested in the exemplary semiconductor structures may, or may not, be explicitly present in the first data since the lightly-doped first conductivity type region 32 has the same dopant concentration as the lightly-doped first conductivity type semiconductor layer 12. Thus, in the data structure 920, the photodiode may be represented by the first data and the second data.

The tensile-stress-generating structure may comprise a dielectric gate spacer laterally enclosing the gate electrode, and the normal tensile stress may be transmitted through the gate electrode into the semiconductor substrate. In this case, the fifth data represents the dielectric gate spacer in the design structure 920, The tensile-stress-generating structure may comprise a tensile-stress-generating dielectric layer laterally enclosing the gate electrode and overlying the second conductivity type charge collection well and the floating drain. In this case, the fifth data represents the tensile-stress-generating dielectric layer. The tensile-stress-generating dielectric layer may, or may not, overlie the drain side metal semiconductor alloy portion and the gate metal semiconductor alloy portion.

The design structure may further comprise another data representing a drain side metal semiconductor alloy portion located directly on the floating drain and yet another data representing a gate metal semiconductor alloy portion located directly on the gate electrode.

The design process 910 may include using a variety of inputs; for example, inputs from library elements 930 which may house a set of commonly used elements, circuits, and devices, including models, layouts, and symbolic representations, for a given manufacturing technology (e.g., different technology nodes such as 32 nm, 45 nm, and 90 nm, etc.), design specifications 940, characterization data 950, verification data 960, design rules 970, and test data files 985 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the present invention. The design structure of the present invention is not limited to any specific design flow.

Design process 910 preferably translates an embodiment of the invention as shown in FIG. 2, along with any additional integrated circuit deign or data (if applicable), into a second design structure 990. Design structure 990 resides on a storage medium in a data format used for the exchange of layout data of integrated circuits and/or symbolic data format (e.g., information stored in GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing though the manufacturing line, and any other data required by a semiconductor manufacturer to produce an embodiment of the invention as shown in FIG. 2. Design structure 990 may then proceed to a stage 995 where, for example, design structure 990 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a lightly-doped first conductivity type semiconductor layer containing a lightly-doped first conductivity type region and located in a semiconductor substrate;
   a second conductivity type charge collection well vertically abutting said lightly-doped first conductivity type region;
   a transfer transistor including a floating drain located in said semiconductor substrate, a gate dielectric vertically abutting a top surface of said lightly-doped first conductivity type semiconductor layer, and a gate electrode vertically abutting said gate dielectric, wherein said second conductivity type charge collection well is a source of said transfer transistor; and
   a tensile-stress-generating structure located on said gate electrode, wherein said tensile-stress-generating structure applies a normal tensile stress between said second conductivity type charge collection well and said floating drain in a direction connecting said second conductivity type charge collection well and said floating drain.

2. The semiconductor structure of claim 1, wherein said normal tensile stress has a vertically compressive component and a horizontally compressive component.

3. The semiconductor structure of claim 1, wherein said lightly-doped first conductivity type region generates an additional normal tensile stress between said lightly-doped first conductivity type region and said floating drain.

4. The semiconductor structure of claim 1, wherein an angle between a bottom surface of said gate dielectric and said direction is non-zero.

5. The semiconductor structure of claim 4, wherein an extension of said direction has a first end in said second conductivity type charge collection well and a second end in said floating drain, wherein said first end has a greater depth from a top surface of said semiconductor substrate than said second end.

6. The semiconductor structure of claim 1, wherein said tensile-stress-generating structure comprises a dielectric gate spacer laterally enclosing said gate electrode, wherein said normal tensile stress is transmitted through said gate electrode into said semiconductor substrate.

7. The semiconductor structure of claim 1, wherein said tensile-stress-generating structure comprises a dielectric layer laterally enclosing said gate electrode and overlying said second conductivity type charge collection well and said floating drain.

8. The semiconductor structure of claim 7, further comprising:
   a drain side metal semiconductor alloy portion located directly on said floating drain; and
   a gate metal semiconductor alloy portion located directly on said gate electrode.

9. The semiconductor structure of claim 8, wherein said dielectric layer overlies said drain side metal semiconductor alloy portion and said gate metal semiconductor alloy portion.

10. The semiconductor structure of claim 8, wherein said dielectric layer does not overlie said drain side metal semiconductor alloy portion and said gate metal semiconductor alloy portion.

11. The semiconductor structure of claim 1, further comprising a first conductivity type well region located in said semiconductor substrate and vertically abutting said floating drain and having a higher dopant concentration than said lightly-doped first conductivity type semiconductor layer.

12. The semiconductor structure of claim 1, further comprising a heavily-doped first conductivity type semiconductor layer located directly underneath said lightly-doped first conductivity type semiconductor layer.

13. The semiconductor structure of claim 1, further comprising a surface pinning layer having a first conductivity type doping and vertically abutting a top surface of said second conductivity type charge collection well and laterally abutting a sidewall of said second conductivity type charge collection well.

14. The semiconductor structure of claim 13, further comprising a shallow trench isolation structure, wherein said surface pinning layer comprises a first horizontal portion abutting a top surface of said semiconductor substrate, a vertical portion laterally abutting said shallow trench isolation structure, and a second horizontal portion vertically abutting said shallow trench isolation structure.

15. The semiconductor structure of claim 13, wherein said lightly-doped first conductivity type semiconductor layer, said second conductivity type charge collection well, and said surface pinning layer comprise a same semiconductor material.

16. The semiconductor structure of claim 15, wherein said same semiconductor material is one of silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials.

17. The semiconductor structure of claim 15, wherein said lightly-doped first conductivity type semiconductor layer, said second conductivity type charge collection well, and said surface pinning layer are epitaxially aligned as a single crystal.

18. A method of forming a semiconductor structure comprising:
   forming a second conductivity type charge collection well directly above a lightly-doped first conductivity type region within a lightly-doped first conductivity type semiconductor layer in a semiconductor substrate;
   forming a transfer transistor on said semiconductor substrate, wherein said transfer transistor comprises a floating drain formed in said semiconductor substrate, a gate dielectric formed directly on a top surface of said lightly-doped first conductivity type semiconductor layer, and a gate electrode formed directly on said gate dielectric, and wherein said second conductivity type charge collection well is a source of said transfer transistor; and
   forming a tensile-stress-generating structure on said gate electrode, wherein said tensile-stress-generating structure applies a normal tensile stress between said second conductivity type charge collection well and said floating drain in a direction connecting said second conductivity type charge collection well and said floating drain.

19. The method of claim 18, wherein said normal tensile stress has a vertically compressive component and a horizontally compressive component.

20. The method of claim 18, wherein a shallow trench isolation structure located closer to said second conductivity type charge collection well than to said floating drain applies an additional normal tensile stress between said second conductivity type charge collection well and said floating drain.

21. The method of claim 18, wherein an angle between a bottom surface of said gate dielectric and said direction is non-zero.

22. The method of claim 21, wherein an extension of said direction has a first end in said second conductivity type charge collection well and a second end in said floating drain, wherein said first end has a greater depth from a top surface of said semiconductor substrate than said second end.

23. The method of claim 18, wherein said method further comprises:
   forming a dielectric layer over said semiconductor substrate and said gate electrode; and
   anisotropically etching said dielectric layer, thereby forming a dielectric gate spacer laterally enclosing said gate electrode, and wherein said dielectric gate spacer constitutes said tensile-stress-generating structure.

24. The method of claim 18, further comprising:
   forming a tensile-stress-generating dielectric layer over said semiconductor substrate and said gate electrode;
   removing a first portion of said tensile-stress-generating dielectric layer over said gate electrode and a second portion of said tensile-stress-generating dielectric layer over said floating drain;
   forming a drain side metal semiconductor alloy portion directly on said floating drain; and
   forming a gate metal semiconductor alloy portion directly on said gate electrode.

25. The method of claim 18, further comprising:
   forming a drain side metal semiconductor alloy portion directly on said floating drain;
   forming a gate metal semiconductor alloy portion directly on said gate electrode; and
   forming a tensile-stress-generating dielectric layer over said drain side metal semiconductor alloy portion and said gate metal semiconductor alloy portion.

26. The method of claim 18, further comprising forming a first conductivity type well region having a higher dopant concentration than said lightly-doped first conductivity type semiconductor layer directly underneath said floating drain.

27. The method of claim 18, wherein said semiconductor substrate comprises a heavily-doped first conductivity type semiconductor layer located directly underneath said lightly-doped first conductivity type semiconductor layer.

28. The method of claim 18, further comprising forming a surface pinning layer having a first conductivity type doping directly on a top surface of said second conductivity type charge collection well, wherein said surface pinning layer laterally abuts a sidewall of said second conductivity type charge collection well.

29. A design structure embodied in a machine readable medium for designing, manufacturing, or testing a design, said design structure comprising:
   a first data representing a lightly-doped first conductivity type semiconductor layer in a semiconductor substrate;
   a second data representing a second conductivity type charge collection well located directly on the lightly-doped first conductivity type semiconductor layer, wherein the first data and the second data collectively represent a photodiode;
   a third data representing a transfer transistor and including said second data and a fourth data representing a floating drain, wherein said second conductivity type charge collection well constitutes a source of said transfer transistor; and
   a fifth data representing a tensile-stress-generating structure located on said transfer transistor and including a sixth data representing a body of said transfer transistor to which a normal tensile stress is applied in a direction connecting said second conductivity type charge collection well and said floating drain.

30. The design structure of claim 29, wherein said third data further includes a seventh data representing a gate dielectric vertically abutting a top surface of said lightly-doped first conductivity type semiconductor layer and an eighth data representing a gate electrode vertically abutting said gate dielectric.

31. The design structure of claim 29, wherein said design structure comprises a netlist.

32. The design structure of claim 29, wherein said design structure resides on storage medium as a data format used for exchange of layout data of integrated circuits.

33. The design structure of claim 29, further comprising another data representing a heavily-doped first conductivity type semiconductor layer located directly underneath said lightly-doped first conductivity type semiconductor layer.

34. The design structure of claim 29, further comprising another data representing a first conductivity type well region vertically abutting said floating drain and located in said semiconductor substrate and having a higher dopant concentration than said lightly-doped first conductivity type semiconductor layer.

35. The design structure of claim 29, further comprising another data representing a surface pinning layer having a first conductivity type doping and located directly on a top surface of said second conductivity type charge collection well, wherein said surface pinning layer laterally abuts a sidewall of said second conductivity type charge collection well.

* * * * *